(12) United States Patent
Bai et al.

(10) Patent No.: US 11,843,169 B2
(45) Date of Patent: *Dec. 12, 2023

(54) ANTENNA SYSTEM FOR SMALL FORM FACTOR

(71) Applicant: ARRIS Enterprises LLC, Suwanee, GA (US)

(72) Inventors: Qiang Bai, West Yorkshire (GB); Ian Clarke, West Yorkshire (GB)

(73) Assignee: ARRIS ENTERPRISES LLC, Suwanee, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/994,544

(22) Filed: Nov. 28, 2022

(65) Prior Publication Data

US 2023/0089116 A1 Mar. 23, 2023

Related U.S. Application Data

(63) Continuation of application No. 16/900,085, filed on Jun. 12, 2020, now Pat. No. 11,539,124.

(60) Provisional application No. 62/860,375, filed on Jun. 12, 2019.

(51) Int. Cl.
  *H01Q 1/52* (2006.01)
  *H05K 1/02* (2006.01)
  *H04W 84/12* (2009.01)

(52) U.S. Cl.
  CPC ........... *H01Q 1/523* (2013.01); *H05K 1/0243* (2013.01); *H04W 84/12* (2013.01); *H05K 2201/10106* (2013.01)

(58) Field of Classification Search
  CPC ........ H01Q 1/22; H01Q 1/38–48; H01Q 1/52; H05K 1/0243; H05K 2201/10
  See application file for complete search history.

(56) References Cited

U.S. PATENT DOCUMENTS

| | | | |
|---|---|---|---|
| 6,624,790 | B1 | 9/2003 | Wong et al. |
| 10,305,171 | B1 | 5/2019 | Navarro |
| 2004/0018815 | A1 | 1/2004 | Lin et al. |
| 2005/0140551 | A1 | 8/2005 | Kaluzni |
| 2005/0168397 | A1 | 8/2005 | Kaluzni |
| 2009/0009400 | A1 | 1/2009 | Kim et al. |
| 2010/0315313 | A1 | 12/2010 | Wu |
| 2011/0215971 | A1 | 9/2011 | Rao |
| 2012/0287011 | A1 | 11/2012 | Smith |
| 2013/0285857 | A1 | 10/2013 | Schultz |

(Continued)

OTHER PUBLICATIONS

International Search Report (Annex to Form PCT/ISA/206) issued With "Invitation to Pay Additional Fees" dated Sep. 16, 2020 in International (PCT) Application No. PCT/US2020/037502.

(Continued)

*Primary Examiner* — Hasan Islam
(74) *Attorney, Agent, or Firm* — Wenderoth, Lind & Ponack, L.L.P.

(57) ABSTRACT

A multiple-antenna device including a printed circuit board, a first antenna formed into a first corner of the printed circuit board, a second antenna formed into a second corner of the printed circuit board, and a dual-band decoupler formed in the printed circuit board between the first antenna and the second antenna. The multiple-antenna device includes WLAN circuitry located on the printed circuit board between the first antenna and the decoupler. The first and second antennas have polarizations orthogonal to each other.

20 Claims, 7 Drawing Sheets

(56) References Cited

U.S. PATENT DOCUMENTS

2016/0049723 A1 2/2016 Baks et al.
2019/0165454 A1 5/2019 Lee

OTHER PUBLICATIONS

International Preliminary Report on Patentability and Written Opinion of the International Searching Authority dated Dec. 14, 2021 in International (PCT) Application No. PCT/US2020/037502.
Office Action dated Aug. 23, 2023 in corresponding Canadian Application No. 3,129,153.

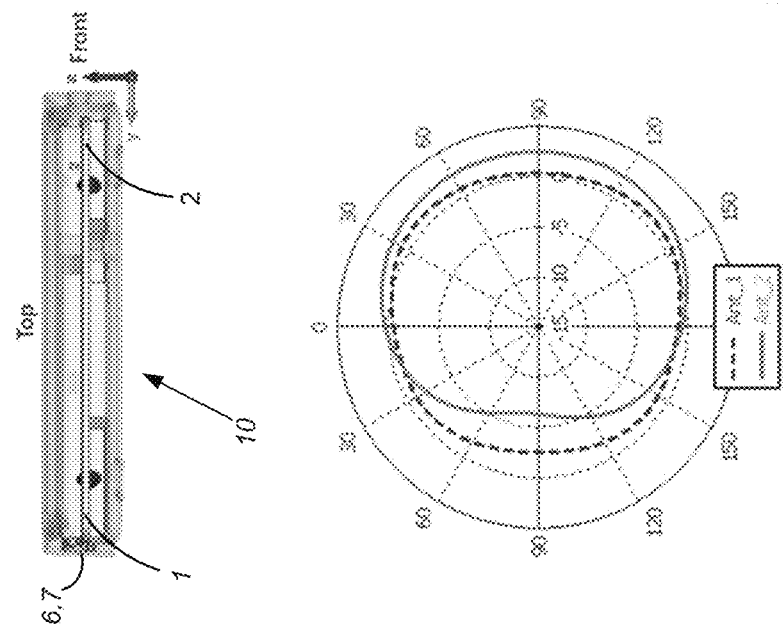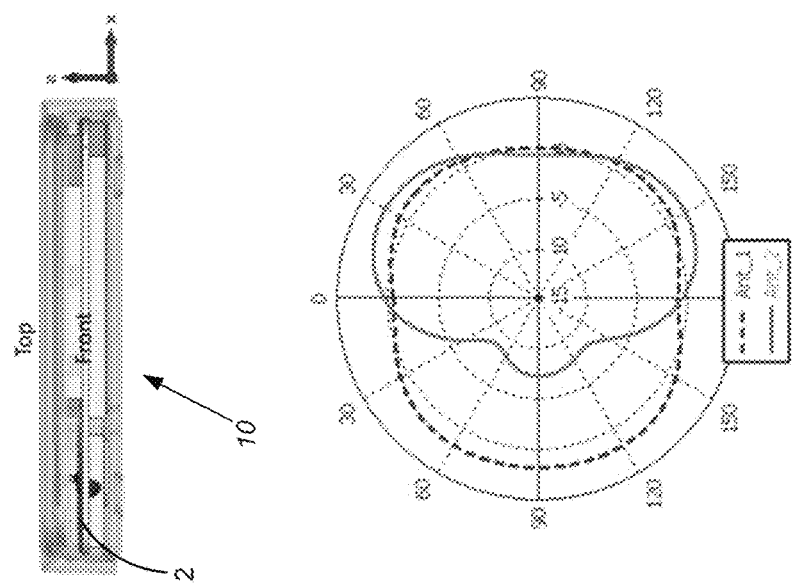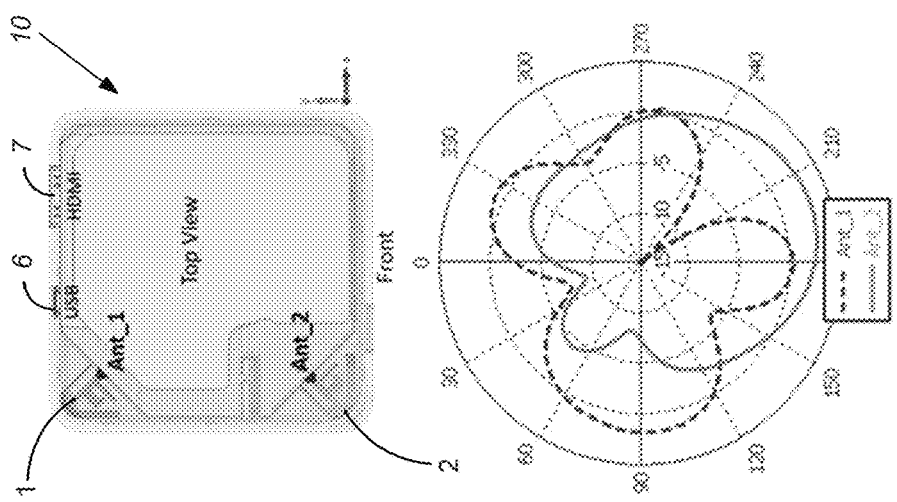

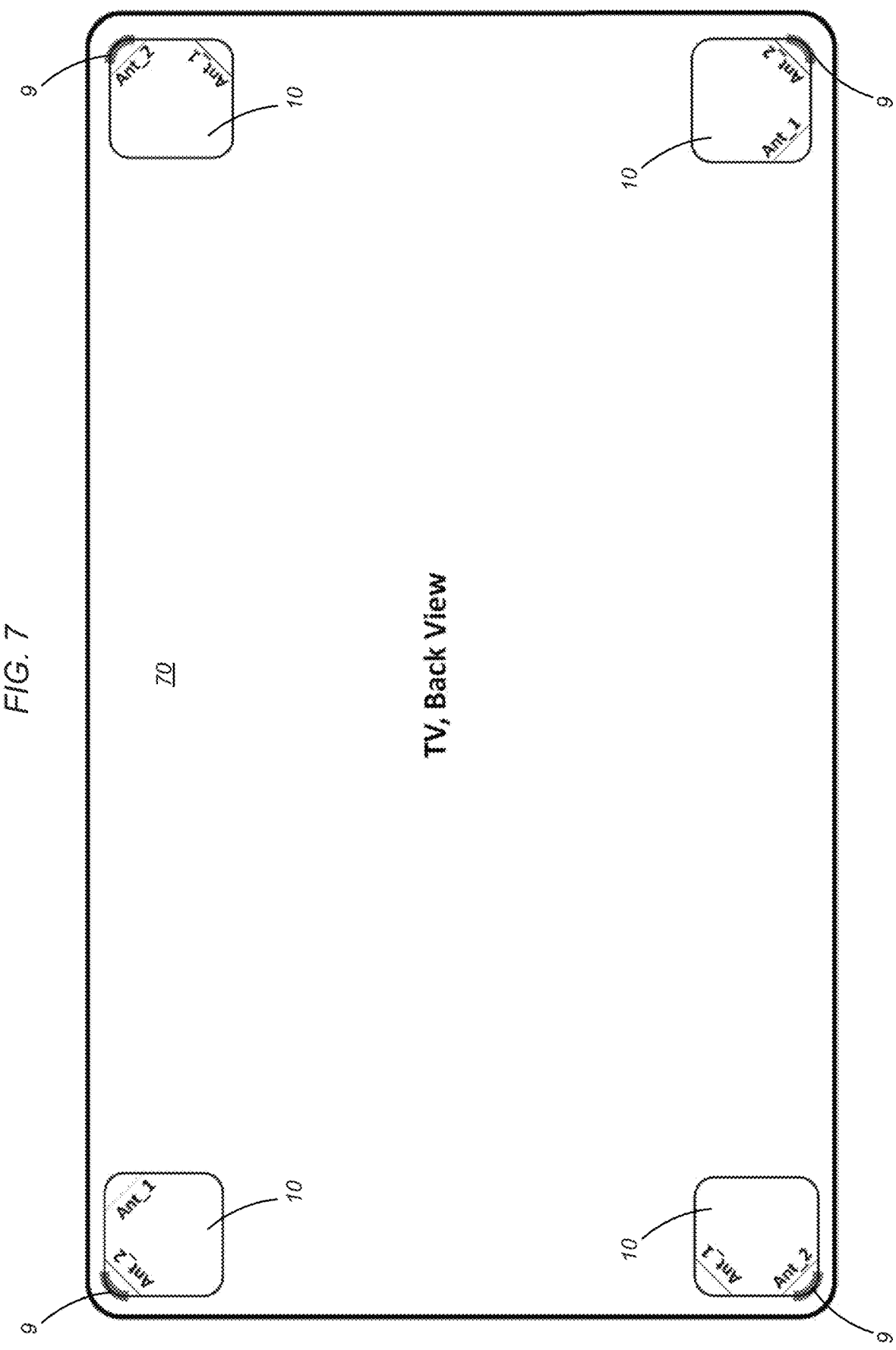

ANTENNA SYSTEM FOR SMALL FORM FACTOR

BACKGROUND

Customer Premises Equipment (CPE) such as a digital set-top box (STB) are moving towards ultra-small form factors (e.g. a TV stick) and increasingly are placed behind a TV. The key challenge of designing on-board wireless local area network (WLAN) multiple-input and multiple-output (MIMO) antenna system for low form factor devices is to maximize antenna performance while maintaining high isolation between antennas and EMI hostile components. Multiple WLAN antennas in a MIMO configuration are required to improve reach and throughput. Placement of the device behind the TV can be critical. The TV behaves as a blockage apparatus to the reception and transmission of the WLAN signals. Due to low internal space of ultra-small form factor STB's the antennas will have low efficiency and high mutual coupling and likely to experience a high detuning effect and radiation blockages especially if the device is mounted behind a TV screen. In addition, due to low internal space, antennas will be placed in proximity to Electromagnetic Interference (EMI) hostile components/buses, such as double data rate (DDR) components, peripheral component interconnect express (PCIe), flash memory, and high-definition multimedia interface (HDMI), which will heavily impact antenna WLAN sensitivity and system throughput. Due to very limited device internal height (generally <12 mm) and antenna clearance, it is not possible to have high performance off-board antennas and onboard PCB etched antennas are therefore the preferred choice. However, PCB real estate is scarce and can be costly depending on the PCB technology used such as multi-layer high density interconnect (HDI) PCB. Prior antenna solutions are generally rectangular resulting in occupancy of prime PCB real estate and therefore resulting in a larger device. Prior designs generally have very low antenna to antenna isolation resulting in low MIMO gain or single input, single output (SISO) operation. Low MIMO gain causes low data throughput and/or lower WLAN reach/coverage. EMI is one of the key issues for WLAN systems designed for small form factor devices. Consequently, other small factor products typically have low WLAN sensitivity resulting in poor coverage or throughput.

SUMMARY

In embodiments described herein, a combination of a custom designed antenna type, antenna locations, antenna orientations, a strategically placed dual band de-coupler structure, and visual indicators on the product to guide product placement behind a TV serve to minimize EMI issues and are considered through the whole antenna design process in order to address and overcome deficiencies in prior antenna designs.

The present disclosure explains examples of a multiple-antenna device including a printed circuit board, a first antenna formed into a first corner of the printed circuit board, a second antenna formed into a second corner of the printed circuit board, wherein the first and second antennas are oriented 90 degrees with respect to one another.

Other examples of a multiple-antenna device include a decoupler formed in the printed circuit board between the first antenna and the second antenna. The decoupler may be a dual band decoupler decoupling the first and second antennas in the 2.4 GHz and 5 GHz bands.

Other examples of a multiple-antenna device include WLAN, e.g., Wi-Fi, circuitry located on the printed circuit board between the first antenna and the decoupler, (or between the first and second antennas if there is no decoupler) wherein at least one of the first antenna and second antenna is connected to the Wi-Fi circuitry.

The first and second antennas may have polarizations orthogonal to each other.

Other examples of a multiple-antenna device include electronic circuitry, such as a USB port or an HDMI port, which exhibits electro-magnetic interference during operation, located on the printed circuit board other than at the first and second corners of the printed circuit board.

At least one of the first antenna and the second antenna may have radiation nulls directed toward the electronic circuitry.

Other examples of a multiple-antenna device include short range wireless communication circuitry (e.g., Bluetooth circuitry) located on the printed circuit board, and at least one of the first and second antennas is connected to the short range wireless communication circuitry. For example, the second antenna may be connected to the short range wireless communication circuitry, and a distance between the second antenna and the electronic circuitry which exhibits electro-magnetic interference is greater than a distance between the first antenna and the electronic circuitry which exhibits electro-magnetic interference.

The multiple-antenna device according to claim 1, further comprising a visual indicator located on the printed circuit board at a location corresponding to the second antenna configured to provide visual guidance for orienting the multiple antenna device behind a television.

The visual indicator may include one or more of a light emitting diode or a light pipe.

At least one of the first and second antennas may be a copper etched antenna etched from a copper layer of the printed circuit board, or a stand-alone antenna attached to the printed circuit board.

BRIEF DESCRIPTION OF THE DRAWINGS

FIG. 5A is a top view of the multiple-antenna device.
FIG. 5B shows the radiation pattern of the antennas of the multiple-antenna device as shown in FIG. 5A.
FIG. 5C is a front view of the multiple-antenna device.
FIG. 5D shows the radiation pattern of the antennas of the multiple-antenna device as shown in FIG. 5C.
FIG. 5E is a side view of the multiple-antenna device.
FIG. 5F shows the radiation pattern of the antennas of the multiple-antenna device as shown in FIG. 5E.

FIG. 7 shows example placements of the multiple-antenna device on the back of a television.

DETAILED DESCRIPTION

The following detailed description is made with reference to the accompanying drawings and is provided to assist in a comprehensive understanding of various example embodiments of the present disclosure. The following description includes various details to assist in that understanding, but these are to be regarded merely as examples and not for the purpose of limiting the present disclosure as defined by the appended claims and their equivalents. The words and phrases used in the following description are merely used to enable a clear and consistent understanding of the present disclosure. In addition, descriptions of well-known structures, functions, and configurations may have been omitted for clarity and conciseness. Those of ordinary skill in the art will recognize that various changes and modifications of the examples described herein can be made without departing from the spirit and scope of the present disclosure.

Figure 1:
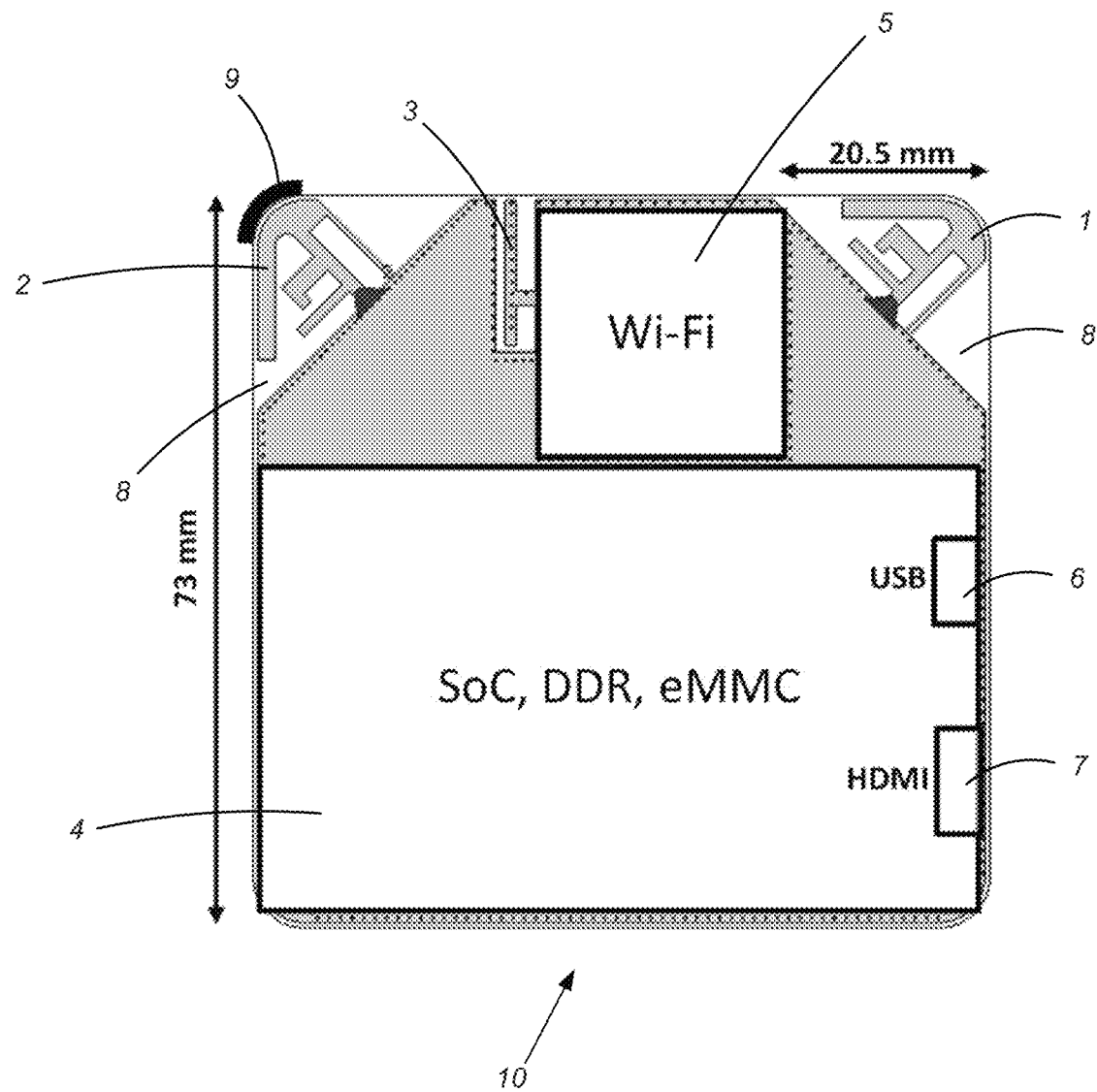
FIG. 1 is an illustration of a multiple-antenna device.

FIG. 1 is an illustration of a multiple-antenna device 10. The example of a multiple antenna device 10 shown in FIG. 1 is a compact dual-band WLAN dual-antenna device, including antennas 1 and 2, a printed circuit board (PCB) 8, having various electronic circuits 4, such as a system on a chip (SoC), a memory, such as a DDR, and/or an embedded multi-media controller (eMMC). Input/output ports, such as universal serial bus, USB 6, and high-definition multimedia interface, HDMI 7, are also connected to the PCB 8. The device 10 may provide and support a WLAN via WLAN circuitry, e.g., Wi-Fi circuitry 5 included on the PCB 8. For example, the PCB 8 may include circuitry to support 2×2 dual-band IEEE802.11ac and/or Bluetooth low energy wireless communication system. Placing the Wi-Fi circuitry 5 near the antennas 1 and 2 is optimal because it allows for short PCB trace lengths between the Wi-Fi circuitry 5 and the antennas 1 and 2. The small form factor portable device may be designed to be mounted behind a display device (e.g., television).

PCB corners have low occupancy in circuit design, and the antenna described herein is shaped and sized to conform to the corners of the PCB to utilized otherwise unused space. A first antenna 1 is disposed on a corner of the PCB 8. A second antenna 2 is formed on another corn of the PCB 8. The first and second antennas 1 and 2 are arranged so as to extend diagonally from the PCB 8. The antennas may be positioned at optimal locations to maximize a distance between the antennas and EMI hostile components such as the HDMI connector 7 and/or DDR traces or other components of the circuitry 4. One of the first and second antennas can be an antenna supporting short-range communications (e.g., antenna 2 supporting Wi-Fi and Bluetooth communications) and may be positioned on the opposite side of the PCB from one or more interfaces (e.g., USB 6, HDMI 7, etc.) that may generate electromagnetic interference. In such a case, the device 10 will include short-range wireless communication circuitry (e.g., Bluetooth circuitry) located somewhere in circuitry locations 4 and 5. Further, the HDMI 7 may be fully screened on both the top and bottom of the HDMI 7.

The device 10 also includes a dual-band decoupler 3 and indicator 9, both of which are discussed in detail below.

The two antennas 1 and 2 may be configured to support one or more MIMO (multiple-input multiple-output) applications. The antennas may have a two-dimensional conformal structure. Placement of the antennas at the corners of the PCB reduces antenna occupation of PCB space that is necessary for other circuitry of the device 10.

The first and second antennas 1 and 2 are designed on a PCB having dimensions such as 73×73×1.2 mm or 74×74×1.2 mm. Each of the first and second antennas 1 and 2 exhibit a −10 dB bandwidth fully covering 2.4 GHz and 5 GHz Wi-Fi bands. The first and second antennas 1 and 2 can provide high efficiency (>76%) with orthogonal polarizations. Antenna peak gain is between 2 dBi and 4.5 dBi. High isolation (>20 dB) is achieved between two antennas for both 2.4 GHz and 5 GHz Wi-Fi bands.

Turning back to FIG. 1., a compact dual-band decoupler 3 may be placed between the first and second antennas 1 and 2 to enhance antenna to antenna isolation, and to provide further isolation between at least one of the antennas and hostile EMI (e.g., USB 6 and HDMI 7 connectors). The decoupler 3 is a PCB etched decoupler located between antennas 1 and 2 of the dual-antenna system and significantly brings down antenna mutual coupling between antennas 1 and 2, resulting in excellent MIMO performance.

Figure 2:
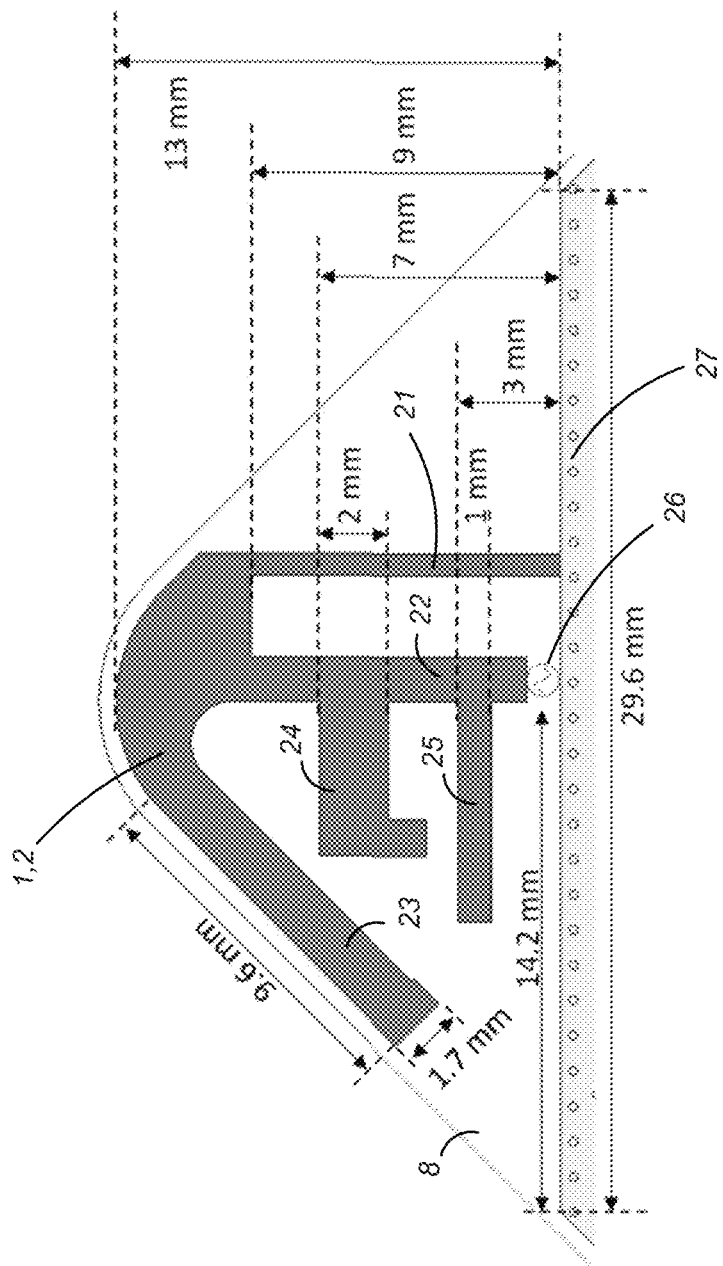
FIG. 2 shows an antenna of the multiple-antenna device.

FIG. 2 shows an enlarged view of the antenna (either the first antenna 1 or the second antenna 2). As shown in FIG. 2, the antenna is a planar inverted-F (PIFA) type PCB trace antenna allowing for reduction in length of the antenna from standard half-wavelength to quarter wavelength. As can be seen more clearly in FIG. 2 the antenna (1,2) can be a copper film where the remaining copper layer is etched away to leave the antenna on the PCB 8. Another option is that the PCB 8 itself is also etched away to leave the copper layer and the underlying PCB material thereunder. Alternatively, the antennas 1 and/or 2 can be separately formed stand-alone antennas attached to the PCB 8. Standalone in this context means that the antenna is not merely a shape left in the copper layer of the PCB, but is a separate part which is then connected to the device. For example, the PCB 8 could end at the PCB ground and the separately formed antenna could be attached to the PCB 8. The stand-alone antenna can be formed, for example, of metal, or it may be formed as an etched antenna on a different PCB and cut out and attached to the device.

The antenna includes a shorting trace 21, a feeding trace 22, a first radiation element 23, a second radiation element 24, and an impedance matching stub 25. The first radiation element 23 is configured to operate (or relatively dominate) in the 2.4 GHz Wi-Fi band, and the second radiation element 24 is configured to operate (or relatively dominate) in the 5.0 GHz Wi-Fi band. Either radiation element can be configured to operate in the 6.0 GHz band. Because of the compact size and shape of the antenna, the impedance matching stub 25 is added to adjust and match the resonance of the first and second radiation elements 23, 24. The length of the matching stub 25, and the location of the matching stub 25 relative to the first and second radiation elements 23, 24, are selected to determine the matching of the feeding trace 22 and allows maximize the resonance of the antenna in the 2.4 GHz and 5 GHz bands. The shorting trace 21 connects to the PCB ground 27. The feeding trace connects to the antenna feeding circuitry via element 26. Alternatively, the connection of the feeding trace (or the shorting trace) could be perpendicular to the figure through a via in a overlying layer.

Example dimensions of the antenna are shown in FIG. 2. The dimensions can be modified to maximize performance depending on the overall size and shape of the device 10. Ideally the length of the first and second radiation elements 23, 24, are set to quarter wavelength of the respective frequency bands (2.4 GHz, 5 GHz, respectively). However, other elements of the entire PCB 8 can also act as part of the antenna. Therefore, the dimensions of the various parts of the antenna are selected to maximize performance based on the characteristics of the entire device. For example, as can be seen in FIG. 1, the device 10 may have a generally square shape with a side length of 73 mm. The corner region of the device 10 (e.g., the corner region of the PCB 8) occupied by the antenna (1 or 2) may have a width of 20.5 mm. Turning back to FIG. 2, the diagonal bottom (as shown in FIG. 2) of the corner region may be 29.9 mm. The height of the antenna may be 13 mm. The shorting trace 21 may have a length of 9 mm and a width of around 1 mm or less. The feeding trace 22 may have a width of approximately between 1 and 2 mm (e.g., 1.2 mm) and is located approximately centrally with respect to the bottom of the corner region (e.g., 14.2 mm from each side of the bottom of the corner region. The first radiation element 23 may have a length of 9.6 mm and a width of 1.7 mm, and is shaped to conform with the placement of the antenna in the corner of the device 10. The second radiation element 24 may have a length or approximately 4 to 5 mm, a width of 2 mm, may be positioned 5-7 mm from the PCB ground 27, and extends from the feeding trace 22 toward the first radiation element 23. The impedance matching stub 25 may have a width of 1 mm, may be positioned 2-3 mm from the PCB ground 27, and extends from the feeding trace 22. Differences in characteristics in the device 10 will dictate differences in the dimensions of the components of the antennas.

Figure 3:
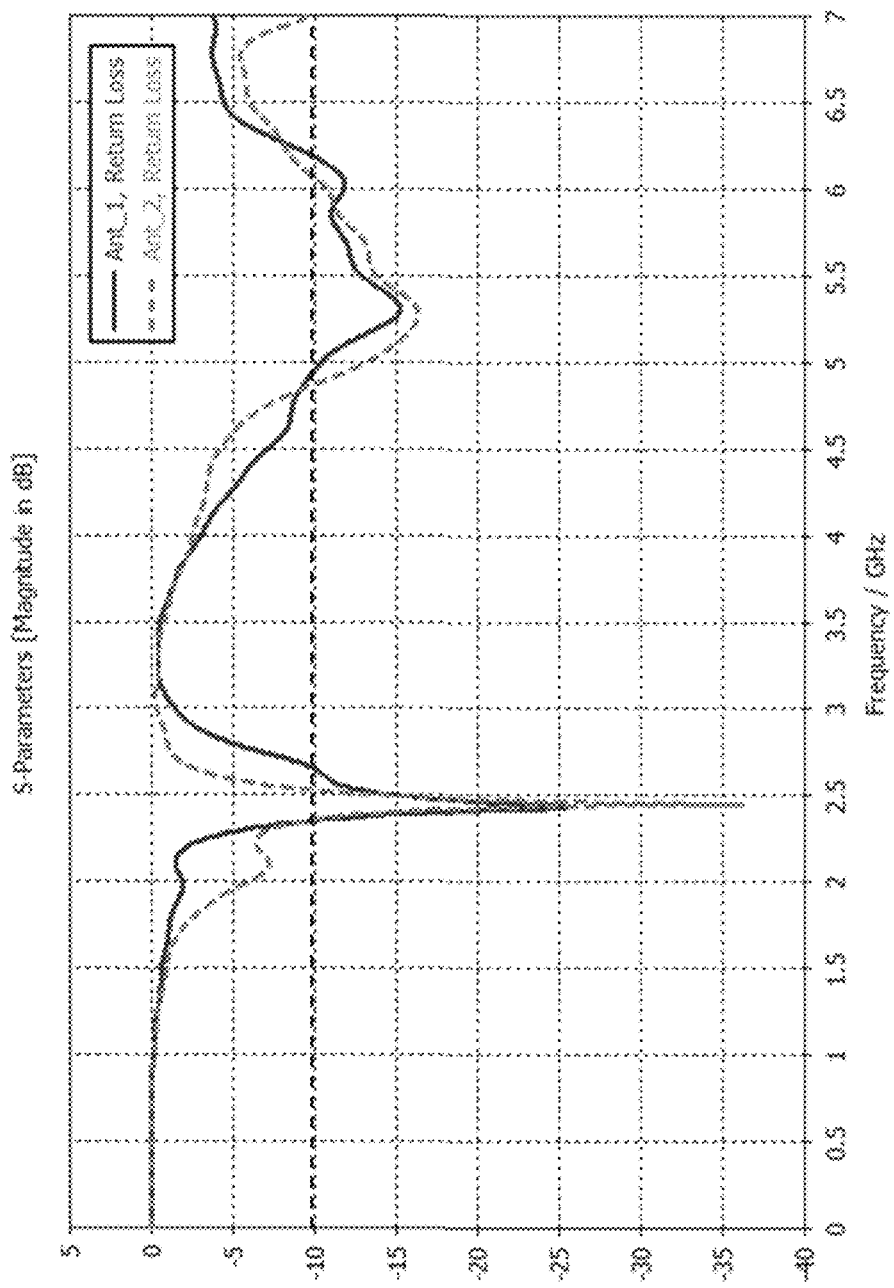
FIG. 3 is a return loss graph (dB/frequency) of the antenna.

FIG. 3 is a return loss graph (dB/frequency) of the antenna shown in FIG. 2. The solid line curve in FIG. 3 shows the return loss of the first antenna 1, and the broken line curve shows the return loss of the second antenna 2. As shown in FIG. 3, the antenna shown in FIG. 2 can provide −10 dB reflection coefficient to fully cover 2.4 GHz and 5 GHz Wi-Fi bands. The curves in FIG. 3 show reflected waves which means that the lower the value, the higher the absorption by, or power transfer to, the antenna. Accordingly, as shown in FIG. 3 the first and second antennas 1 and 2 have good absorption in the 2.4 GHz and 5 GHz Wi-Fi bands.

Figure 4:
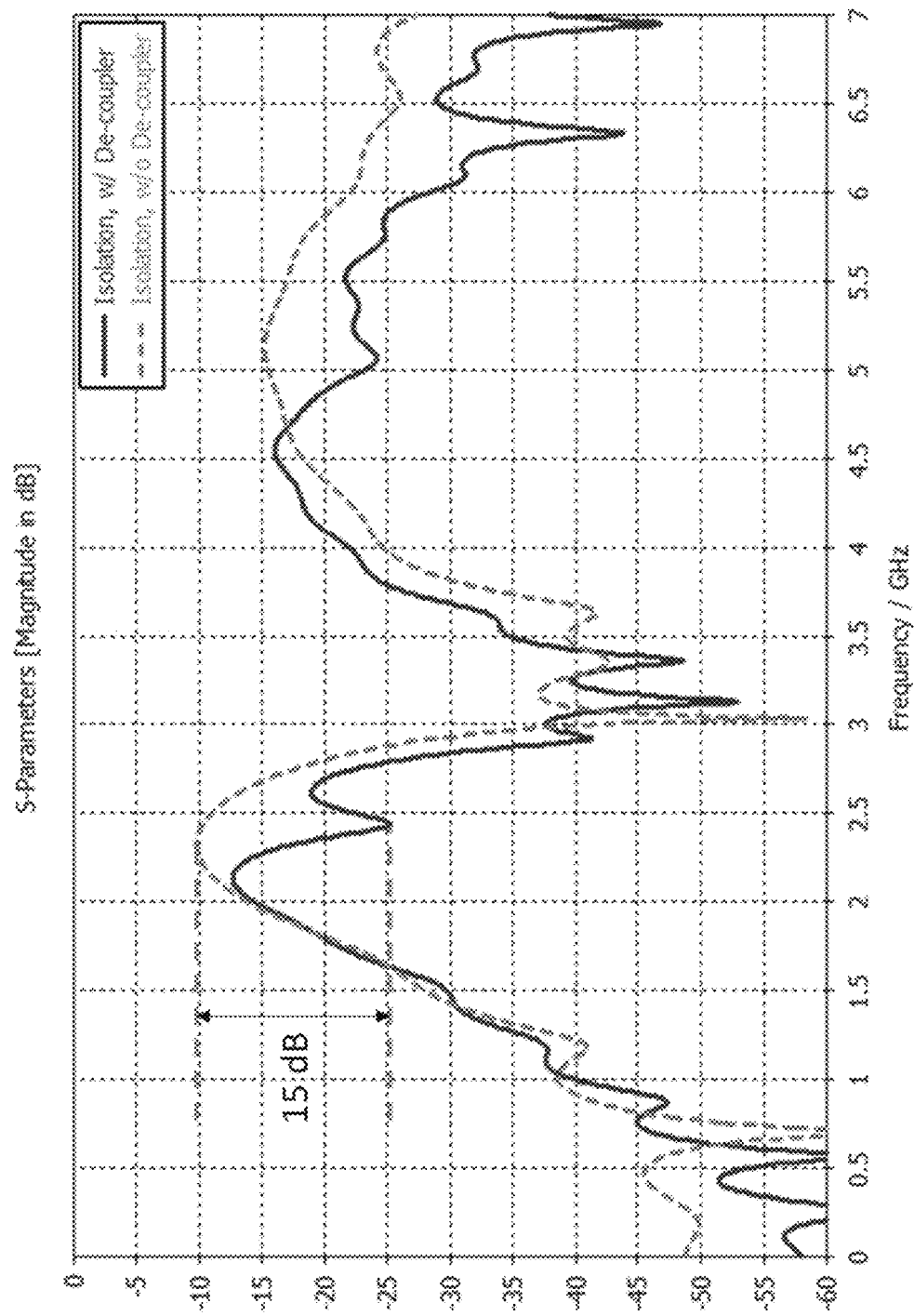
FIG. 4 is a graph showing isolation between a first antenna and a second antenna.

FIG. 4 is a graph (dB/frequency) showing the isolations between first antenna 1 and second antenna 2. The broken line curve shows the isolation without the dual-band decoupler 3, and the solid line curve shows the isolation with the dual-band decoupler 3 being present as shown in FIG. 1. As is evident from FIG. 4, the difference in isolation in the case of the dual-band decoupler 3 being present is pronounces at and around 2.4 GHz and 5 GHz. As seen in FIG. 4, the dual-band decoupler also provides effective decoupling in the 6 GHz Wi-Fi band.

The first and second antennas 1 and 2 may be located and configured with orthogonal polarizations to provide better WLAN coverage. For example, the polarizations of the two antennas may be separated by ninety (90) degrees.

Maximized antenna radiation aperture may achieve a better tolerance against detuning effects when the device 10 (antenna) is close to conductive or dielectric surfaces, such as TV metal back-panel or a glass table. Antenna directivity is specially adjusted to steer main radiation direction away from EMI hot spots, such as USB 6 and HDMI 7 connectors.

Such a diagonal antenna orientation provides a 2-D structure of a dual-antenna system in a shape and size conforming with requirements for a small compact form factor. The antennas 1 and 2, orientation thereof, relative location in relation to circuit components 4 and 5, and diagonal orientation of the antennas with orthogonal polarization relative to one another provides maximized PCB utilization. This 2-D conformal diagonal antenna structure shown in FIG. 1 can fully utilize PCB corners to provide high efficiency, large tolerance and orthogonally polarized antenna solution.

The first and second antennas are configured to exhibit radiation nulls. FIGS. 5A-F, and 6A-F show radiation patterns of the first and second antennas 1 and 2 viewed from the top, front, and side of the device 10. The antennas are configured such that the radiation nulls are adjusted towards rear HDMI/USB connectors, which indicates low noise pickup from EMI hostile components and cables. The 2.4 GHz radiation patterns are discussed below with respect to FIGS. 5A-F, and the 5.5 GHz radiation patterns are discussed below with respect to FIGS. 6A-F.

FIG. 5A is a top view of the multiple-antenna device 10 (in a housing). FIG. 5C is a front view of the multiple-antenna device (in a housing). FIG. 5E is a side view of the multiple-antenna device 10 (in a housing). FIGS. 5B, 5D and 5F shows the radiation patterns viewed from the top, front, and side of the device 10, respectively. For visualization, consider that FIGS. 5B, 5D, and 5F show radiation patterns centered on the view of the device 10 in FIGS. 5A, 5C, and 5E, respectively. The broken line is the radiation pattern of the first antenna 1, and the solid line is the radiation pattern of the second antenna 2. The outer circle of the radiation patterns represents 5 dB, the next circle in represents 0 dB, the next circle represents −5 dB, the next circle represents −10 dB, and the center point represents −15 db. As can be seen in FIG. 5, the antennas exhibit radiation nulls in directions generally toward the USB 6 and HDMI 7 to the extent that the antennas radiation patterns are significantly lowered in the directions of USB 6 and HDMI 7.

Figures 6A, 6C, 6E:
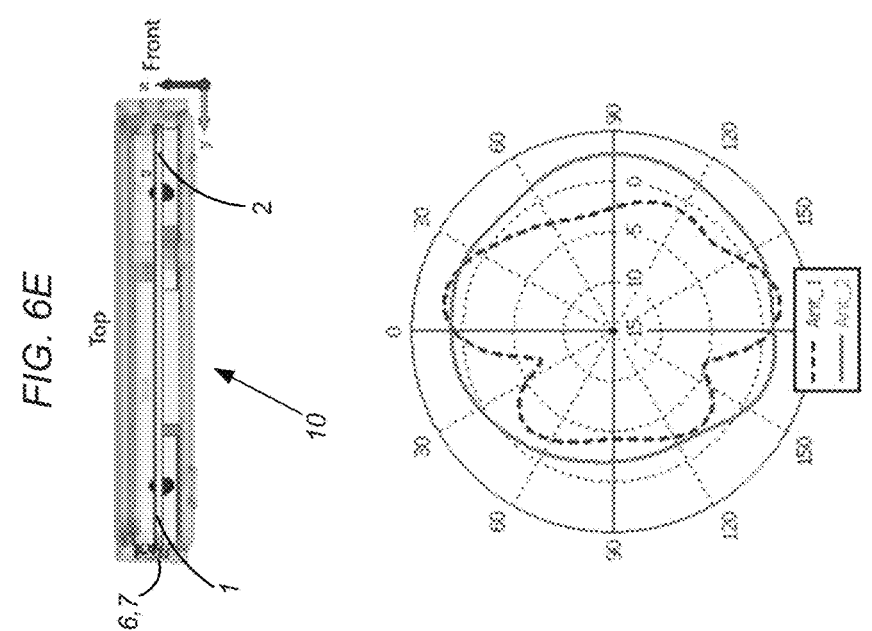
FIG. 6A is a top view of the multiple-antenna device.
FIG. 6C is a front view of the multiple-antenna device.
FIG. 6E is a side view of the multiple-antenna device.
Figures 6B, 6D, 6F:
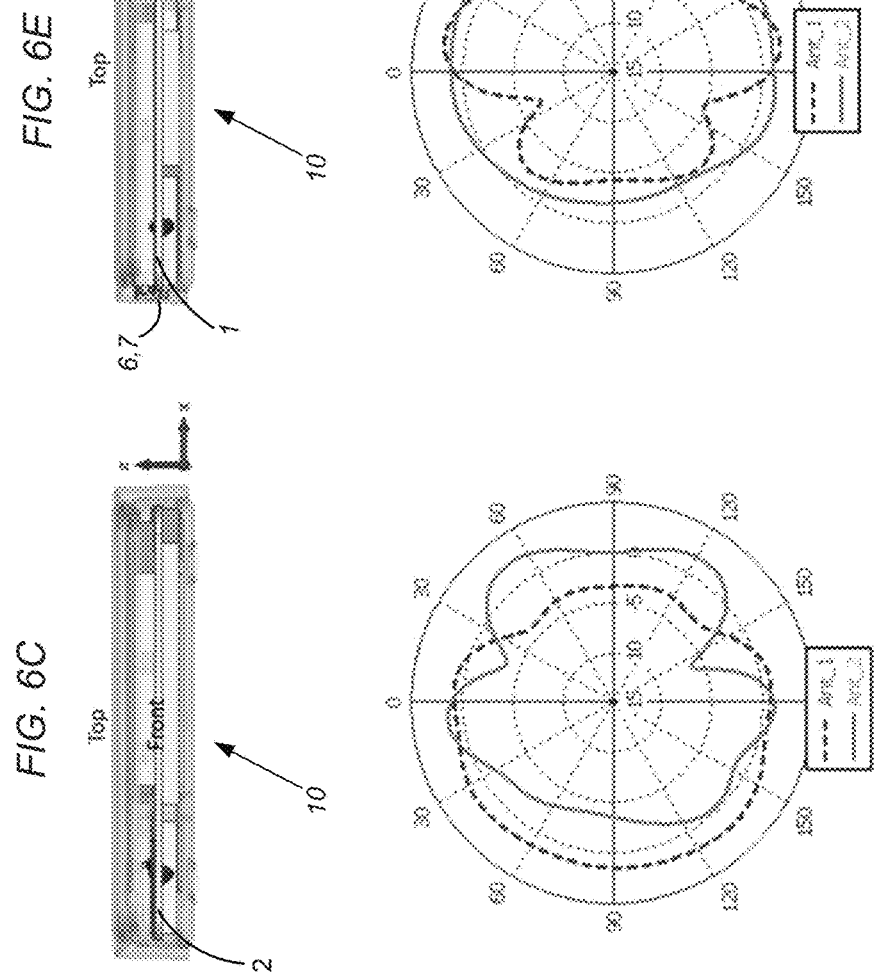
FIG. 6B shows the radiation pattern of the antennas of the multiple-antenna device as shown in FIG. 6A.
FIG. 6D shows the radiation pattern of the antennas of the multiple-antenna device as shown in FIG. 6C.
FIG. 6F shows the radiation pattern of the antennas of the multiple-antenna device as shown in FIG. 5E.

FIG. 6A is a top view of the multiple-antenna device 10 (in a housing). FIG. 6C is a front view of the multiple-antenna device 10 (in a housing). FIG. 6E is a side view of the multiple-antenna device 10 (in a housing). FIGS. 6B, 6D and 6F shows the radiation patterns viewed from the top, front, and side of the device. For visualization, consider that FIGS. 6B, 6D, and 6F show radiation patterns centered on the view of the device 10 in FIGS. 6A, 6C, and 6E, respectively. The broken line is the radiation pattern of the first antenna 1, and the solid line is the radiation pattern of the second antenna 2. The outer circle of the radiation patterns represents 5 dB, the next circle in represents 0 dB, the next circle represents −5 dB, the next circle represents −10 dB, and the center point represents −15 db. As can be seen in FIG. 6, the antennas exhibit radiation nulls in directions generally toward the USB 6 and HDMI 7 to the extent that the antennas radiation patterns are significantly lowered in the directions of USB 6 and HDMI 7.

The radiation patterns in FIGS. 5 and 6 show that even with placement of the first antenna 1 at the rear of the compact device 10, near the EMI hostile components USB 6, and HDMI 7, the antennas still achieve isolation from those EMI hostile components and the device is still able to communicate in the 2.4 GHz and 5 GHz bands effectively. Some characteristics that contribute to the isolation are the radiation nulls of the first antenna 1 at and around 30 and 300 degrees and the radiation nulls of the second antenna 2 at and around 25 and 85 degrees.

The dual-antenna system may be used, for example, within a CPE device such as a TV dongle. In embodiments, the antenna system can be used in similar low form factor devices. The distance between two antennas can be further reduced to fit in smaller PCBs.

The PCB may include an antenna system that: fully utilizes the available PCB surface to maximize antenna performance; provides orthogonal polarization to enhance connections behind the display device; reduces potential EMI impacts; and achieves satisfactory isolation between antennas that are near in proximity to each other.

TABLE 1

|  | Return Loss | | Isolation | | Efficiency | | Peak Gain | |
| --- | --- | --- | --- | --- | --- | --- | --- | --- |
|  | Freq. (GHz) | | | | | | | |
|  | 2.4-2.5 | 5.15-5.875 | 2.4-2.5 | 5.15-5.875 | 2.4-2.5 | 5.15-5.875 | 2.4-2.5 | 5.15-5.875 |
| Spec. | >10 dB | | >20 dB | | >65% | | <=4.5 dBi | |
| Ant_1 | >10 dB | >10 dB | >20 dB | >20 dB | >65% | >65% | <=4.5 dBi | <=4.5 dBi |
| Ant_2 | >10 dB | >10 dB | >20 dB | >20 dB | >65% | >65% | <=4.5 dBi | <=4.5 dBi |

As shown in Table 1, two antennas can provide greater than 10 dB return loss covering the Wi-Fi frequency range from 2.4 GHz to 2.5 GHz and from 5.15 GHz and 5.875 GHz with higher than 20 dB isolation between two antennas. Two antennas have total efficiencies higher than 65% and peak gains no greater than 4.5 dBi.

The multiple antenna device 10 is included in a housing which can include a visual indicator 9 thereon to indicate the position of antenna 2, or otherwise indicate to the user the correct orientation of the device 10 when mounting behind a television. The visual indicator can be a simple printing, painting, label, or feature on the device 10 itself. The visual indicator 9 can be in the shape of an arc on the corner of the device 10. The visual indicator 9 can include a light emitting diode (LED) placed at the corner location as shown in FIG. 1. The visual indicator can include a light pipe in combination with an LED to properly place the location of the light, and/or to provide a visual indicator of a particular shape. For example, the LED could be on the interior of the housing on the PCB with a light pipe arranged to guide the light from the LED to the outer corner of the device 10.

FIG. 7 shows example placements of the device 10 on the back of a television 70. Such placement is often important to users. However, the position of Wi-Fi devices behind a television often creates a situation where the performance of the antenna of the device is compromised due to interference from components of the television. The diagonal orientation of the first and second antennas 1 and 2 with respect to the device 10, and the orthogonal polarizations of the first and second antennas 1 and 2 serve to allow the device 10 to function effectively when located behind a television. With the first antennas located, oriented and having orthogonal polarizations as discussed above ensures that at least one the first antenna 1 and second antenna 2 will have good reception at all times, thereby ensuring the device will be able to always have a connection to the Wi-Fi access point. However, proper placement and orientation of the device 10 relative to the television can ensure good reception of both the first antenna 1 and second antenna 2.

As shown in FIG. 7 the visual indicator 9 provides a guide for the user to locate and orient the device 10 in the corner of the TV 70. The corner locations represent the optimal placement options of the antenna device 10 to ensure proper reception by at least one of the first antenna 1 and second antenna 2. At these locations and orientations shown in FIG. 7 (with antenna 2 facing outward from a corner of the TV, one or more of the first antenna 1 and second antenna 2 will always have a wireless communication path to the companion network router or access point that is unimpeded by interference from the television.

The subject matter of the present disclosure is provided as examples. However, further features or variations are contemplated in addition to the features described above. It is contemplated that the implementation of the components and functions of the present disclosure can be done with any newly arising technology that may replace any of the above implemented technologies. Additionally, the above described examples do not limit the scope, applicability, or configurations set forth in the claims. Some changes may be made in the function and arrangement of elements discussed without departing from the spirit and scope of the disclosure. Various embodiments may omit, substitute, or add various procedures or components as appropriate. For instance, features described with respect to certain embodiments may be combined in other embodiments.

What we claim is:

1. A multiple-antenna device comprising:
   a printed circuit board;
   a first antenna disposed on a first corner of the printed circuit board;
   a second antenna disposed on a second corner of the printed circuit board; and
   a decoupler formed in the printed circuit board between the first antenna and the second antenna, wherein the decoupler is etched on the printed circuit board, and wherein the decoupler provides decoupling in a 6 GigaHertz (GHz) Wi-Fi band; and
   wherein the first and second antennas have orthogonal polarizations relative to one another.

2. The multiple-antenna device according to claim 1, wherein the first antenna disposed on the first corner comprises the first antenna formed into the first corner and the second antenna disposed on the second corner comprises the second antenna formed into the second corner.

3. The multiple-antenna device according to claim 1, wherein the decoupler is a dual band decoupler.

4. The multiple-antenna device according to claim 2, further comprising WLAN circuitry located on the printed circuit board between the first antenna and the decoupler, wherein at least one of the first antenna and second antenna is connected to the WLAN circuitry.

5. The multiple-antenna device according to claim 1, wherein the first and second antennas have a diagonal orientation.

6. The multiple-antenna device according to claim 1, further comprising electronic circuitry, which exhibits electro-magnetic interference during operation, located on the printed circuit board other than at the first and second corners of the printed circuit board.

7. The multiple-antenna device according to claim 6, wherein at least one of the first antenna and the second antenna have radiation nulls directed toward the electronic circuitry.

8. The multiple-antenna device according to claim 6, wherein the electronic circuitry which exhibits electro-magnetic interference comprises at least one of a USB port or an HDMI port.

9. The multiple-antenna device according to claim 6, further comprising short range wireless communication circuitry located on the printed circuit board, wherein the second antenna is connected to the short range wireless communication circuitry, and a distance between the second antenna and the electronic circuitry which exhibits electro-magnetic interference is greater than a distance between the first antenna and the electronic circuitry which exhibits electro-magnetic interference.

10. The multiple-antenna device according to claim 9, wherein the short range wireless communication circuitry is Bluetooth circuitry.

11. The multiple-antenna device according to claim 1, further comprising WLAN circuitry located on the printed circuit board between the first and second antennas.

12. The multiple-antenna device according to claim 1, further comprising a visual indicator located on the printed circuit board at a location corresponding to the second antenna configured to provide visual guidance for orienting the multiple antenna device behind a television.

13. The multiple-antenna device according to claim 12, wherein the visual indicator comprises a light emitting diode.

14. The multiple-antenna device according to claim 12, wherein the visual indicator comprises a light pipe.

15. The multiple-antenna device according to claim 1, wherein at least one of the first and second antennas is a copper etched antenna etched from a copper layer of the printed circuit board.

16. The multiple-antenna device according to claim 1, wherein at least one of the first and second antennas is a stand-alone antenna attached to the printed circuit board, wherein the stand-alone antenna is a separate part which is connected to the multiple-antenna device such that the stand-alone antenna is not a shape left in a copper layer of the printed circuit board.

17. The multiple-antenna device according to claim 1, further comprising short range wireless communication circuitry located on the printed circuit board, wherein at least one of the first and second antennas is connected to the short range wireless communication circuitry.

18. The multiple-antenna device according to claim 17, wherein the short range wireless communication circuitry is Bluetooth circuitry.

19. The multiple-antenna device according to claim 1, wherein the first antenna and the second antenna are arranged so as to extend diagonally from the printed circuit board.

20. A method for forming a multiple antenna device, comprising:
    forming a first antenna on a first corner of a printed circuit board of the multiple antenna device;
    forming a second antenna on a second corner of the printed circuit board; and
    etching a decoupler in the printed circuit board between the first antenna and the second antenna, wherein the decoupler provides decoupling in a 6 GigaHertz (GHz) Wi-Fi band; and
    wherein the first and second antennas are formed to have orthogonal polarizations relative to one another.

* * * * *